(12) United States Patent
Yoshida et al.

(10) Patent No.: US 10,591,823 B2
(45) Date of Patent: Mar. 17, 2020

(54) SUBSTRATE PROCESSING APPARATUS AND SUBSTRATE PROCESSING METHOD

(71) Applicant: TOKYO ELECTRON LIMITED, Minato-ku (JP)

(72) Inventors: Keisuke Yoshida, Koshi (JP); Yuzo Ohishi, Koshi (JP); Keisuke Sasaki, Koshi (JP); Shoichi Terada, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 1124 days.

(21) Appl. No.: 14/974,810

(22) Filed: Dec. 18, 2015

(65) Prior Publication Data

US 2016/0181133 A1    Jun. 23, 2016

(30) Foreign Application Priority Data

Dec. 19, 2014    (JP) .................................. 2014-257248

(51) Int. Cl.
*G03F 7/20* (2006.01)
*H01L 21/67* (2006.01)

(52) U.S. Cl.
CPC ........ *G03F 7/70083* (2013.01); *G03F 7/2008* (2013.01); *G03F 7/70141* (2013.01); *G03F 7/70191* (2013.01); *H01L 21/67115* (2013.01); *H01L 21/67248* (2013.01); *G03F 7/7015* (2013.01); *G03F 7/70433* (2013.01); *G03F 2007/2067* (2013.01)

(58) Field of Classification Search
None
See application file for complete search history.

(56) References Cited

U.S. PATENT DOCUMENTS

| | | | |
|---|---|---|---|
| 5,978,202 A * | 11/1999 | Wadensweiler | .... H01L 21/6833 279/128 |
| 8,455,849 B2 * | 6/2013 | Baluja | .................... G02B 5/208 118/723 R |
| 2012/0132618 A1 | 5/2012 | Baluja et al. | |

FOREIGN PATENT DOCUMENTS

| JP | H04-030519 A | 2/1992 |
|---|---|---|
| JP | 2014-165252 A | 9/2014 |

* cited by examiner

*Primary Examiner* — Benjamin A Schiffman
(74) *Attorney, Agent, or Firm* — Oblon, McClelland, Maier & Neustadt, L.L.P.

(57) ABSTRACT

A substrate processing apparatus includes a hot plate which supports and heats a substrate, a light source which emits etching energy beam such that the etching energy beam etches the substrate held by the hot plate, a window device which is positioned between the light source and the hot plate and transmits the etching energy beam emitted by the light source toward the substrate, and an adjusting device which adjusts emission amounts of the etching energy beam from portions of the window device toward the substrate such that the adjusting device reduces difference in etching amounts of portions of the substrate.

20 Claims, 11 Drawing Sheets

SUBSTRATE PROCESSING APPARATUS AND SUBSTRATE PROCESSING METHOD

CROSS-REFERENCE TO RELATED APPLICATIONS

The present application is based upon and claims the benefit of priority to Japanese Patent Application No. 2014-257248, filed Dec. 19, 2014, the entire contents of which are incorporated herein by reference.

BACKGROUND OF THE INVENTION

Field of the Invention

The present disclosure relates to a substrate processing apparatus and a substrate processing method.

Description of Background Art

In a semiconductor manufacturing process, there is a case where, after a film is formed on a wafer, etching is performed to adjust a film thickness. Japanese Patent Laid-Open Publication No. 2014-165252 describes an apparatus for performing etching for film thickness adjustment. This apparatus includes a hot plate for heating an organic film on a wafer, and an ultraviolet irradiation part that irradiates ultraviolet light to the organic film on the wafer. The entire contents of these publications are incorporated herein by reference.

SUMMARY OF THE INVENTION

According to one aspect of the present invention, a substrate processing apparatus includes a hot plate which supports and heats a substrate, a light source which emits etching energy beam such that the etching energy beam etches the substrate held by the hot plate, a window device which is positioned between the light source and the hot plate and transmits the etching energy beam emitted by the light source toward the substrate, and an adjusting device which adjusts emission amounts of the etching energy beam from portions of the window device toward the substrate such that the adjusting device reduces difference in etching amounts of portions of the substrate.

According to another aspect of the present invention, a method for processing a substrate includes positioning a substrate on a hot plate which holds and heats the substrate, emitting etching energy beam from a light source to the substrate held by the hot plate such that the etching energy beam is transmitted through a window device positioned between the light source and the hot plate and irradiates the substrate, and adjusting emission amounts of the etching energy beam from portions of the window device toward the substrate such that difference in etching amounts of portions of the substrate is reduced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Substrate Processing System

As an example of a substrate processing system, an outline of a film formation processing system 1 according to the present embodiment is described. The film formation processing system 1 forms a film on a semiconductor wafer (substrate). For example, the film formation processing system 1 forms an organic film for flattening an uneven pattern on the semiconductor wafer.

As illustrated in FIG. 1-4, the film formation processing system 1 includes a carrier block 2 and a processing block 3.

The carrier block 2 has a carrier station 21 and a carry-in and carry-out part 22. The carrier station 21 supports multiple carriers 10. Each of the carriers 10 accommodates, as examples of substrates, for example, multiple circular wafers (W) in a sealed state. An opening-closing door for carrying in and out the wafer (W) is provided on a side surface (10a) of each of the carriers 10.

The carry-in and carry-out part 22 is arranged so as to be interposed between the carrier station 21 and the processing block 3, and has multiple opening-closing doors (22a) that respectively correspond to the carriers 10 on the carrier station 21. The carriers 10 on the carrier station 21 are arranged such that the side surfaces (10a) of the carriers 10 respectively face the opening-closing doors (22a). By opening the opening-closing doors (22a) and the opening-closing doors of the side surfaces (10a) at the same time, interiors of the carriers 10 and interior of the carry-in and carry-out part 22 are communicated with each other. The carry-in and carry-out part 22 has therein a transfer arm (A1). The transfer arm (A1) takes out a wafer (W) from a carrier 10 and passes the wafer (W) to the processing block 3, and receives the wafer (W) from the processing block 3 and returns the wafer (W) to the carrier 10.

The processing block 3 has therein multiple processing modules (31-34), a shelf 35 and a carrying arm (A2). The shelf 35 is arranged on the carrier block 2 side in the processing block 3.

The shelf 35 temporarily accommodates a wafer (W) and is used to receive and pass the wafer (W) between the transfer arm (A1) and the processing block 3.

The processing modules (31, 32) each have multiple liquid processing units (U1) that are arranged in an up-down direction. The liquid processing units (U1) each apply a liquid, for example, for forming an organic film on a surface of a wafer (W). A liquid accommodating chamber (R1) is provided at a lower part of each of the processing modules (31, 32) for supplying a liquid to the liquid processing units (U1).

The processing modules (33, 34) each have multiple heat treatment units (U2) and multiple etching units (U3) that are arranged in the up-down direction. The heat treatment units (U2) each performs a heat treatment, for example, associated with formation of an organic film. A specific example of the heat treatment is a heating process or the like for curing a coating film for the formation of the organic film. The etching units (U3) each perform etching for adjusting a film thickness of the organic film that is formed on the surface of the wafer (W).

The processing modules (31-34) are arranged so as to surround the carrying arm (A2) in a plan view. The carrying arm (A2) carries the wafer (W) between the shelf 35 and the processing modules (31-34), and between the processing modules (31-34).

The film formation processing system 1 performs an organic film formation process following the procedures described below. First, the transfer arm (A1) carries a wafer (W) in one of the carriers 10 to the shelf 35. Next, the carrying arm (A2) carries the wafer (W) in the shelf 35 to one of the liquid processing units (U1) of the processing modules (31, 32). The liquid processing unit (U1) applies a liquid for formation of an organic film onto the surface of the wafer (W). Next, the carrying arm (A2) carries the wafer (W) on which the liquid is applied to one of the heat treatment units (U2) of the processing modules (33, 34). The heat treatment unit (U2) performs a heating process to cure the coating film on the surface of the wafer (W). As a result, an organic film is formed on the surface of the wafer (W).

Next, the carrying arm (A2) carries the wafer (W) on the surface of which the organic film is formed to one of the etching units (U3) of the processing modules (33, 34). The etching unit (U3) subjects the organic film to etching in order to adjust the film thickness of the organic film. Next, the carrying arm (A2) carries the wafer (W) on which etching has been performed to the shelf 35. The transfer arm (A1) returns the wafer (W) back into the carrier 10. As a result, the formation process of the organic film is completed.

Etching Unit

Figure 1:
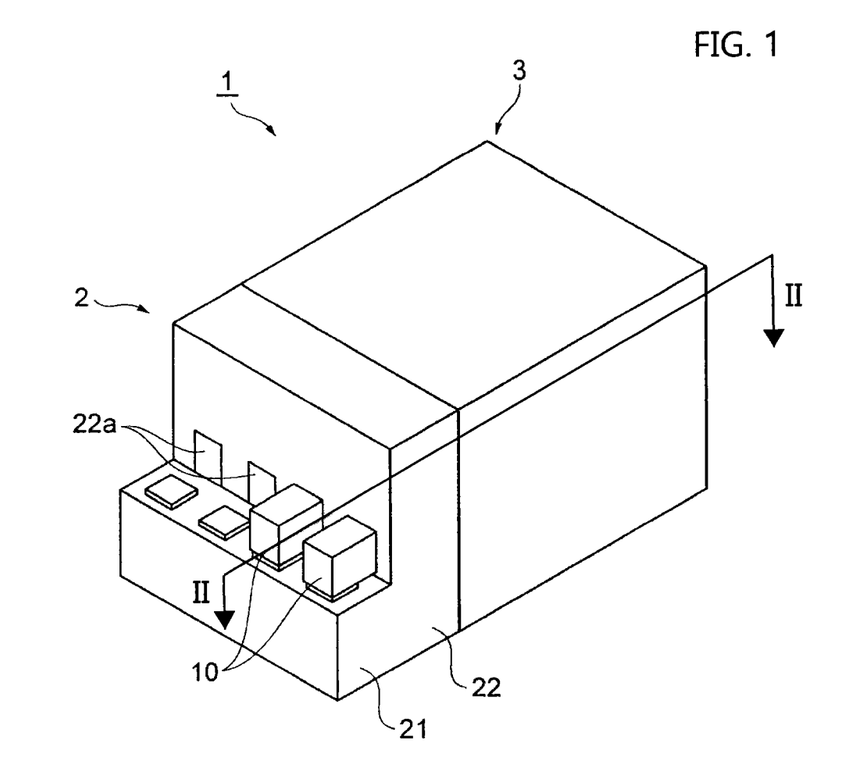
FIG. 1 is a perspective view of a substrate processing system.
Figure 2:
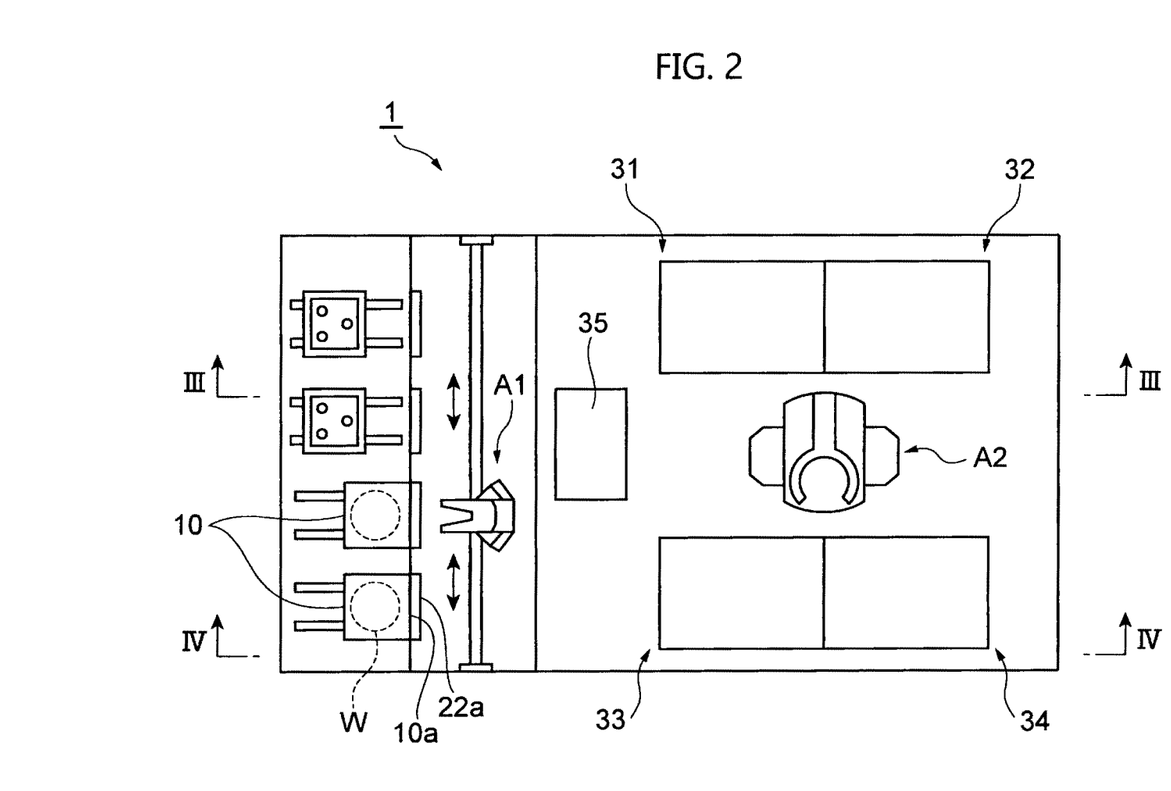
FIG. 2 is a cross-sectional view along an II-II line in FIG. 1.
Figure 3:
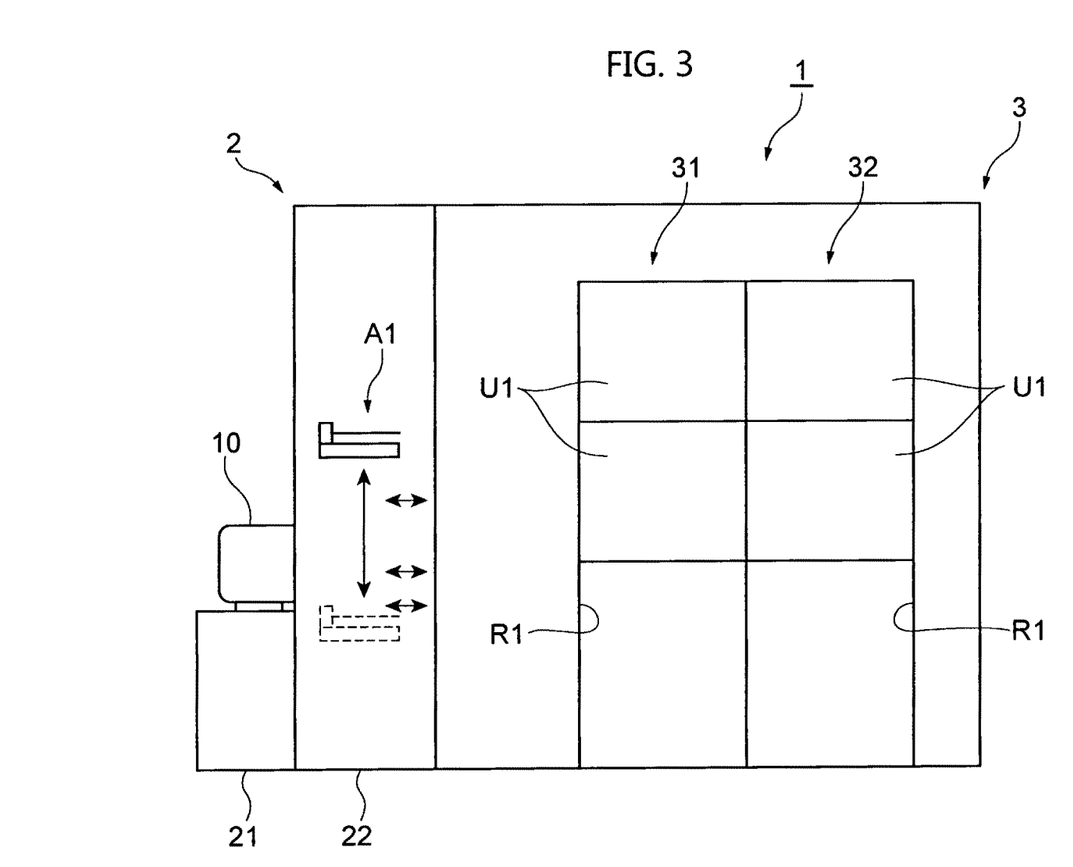
FIG. 3 is a cross-sectional view along an III-III line in FIG. 2.
Figure 4:
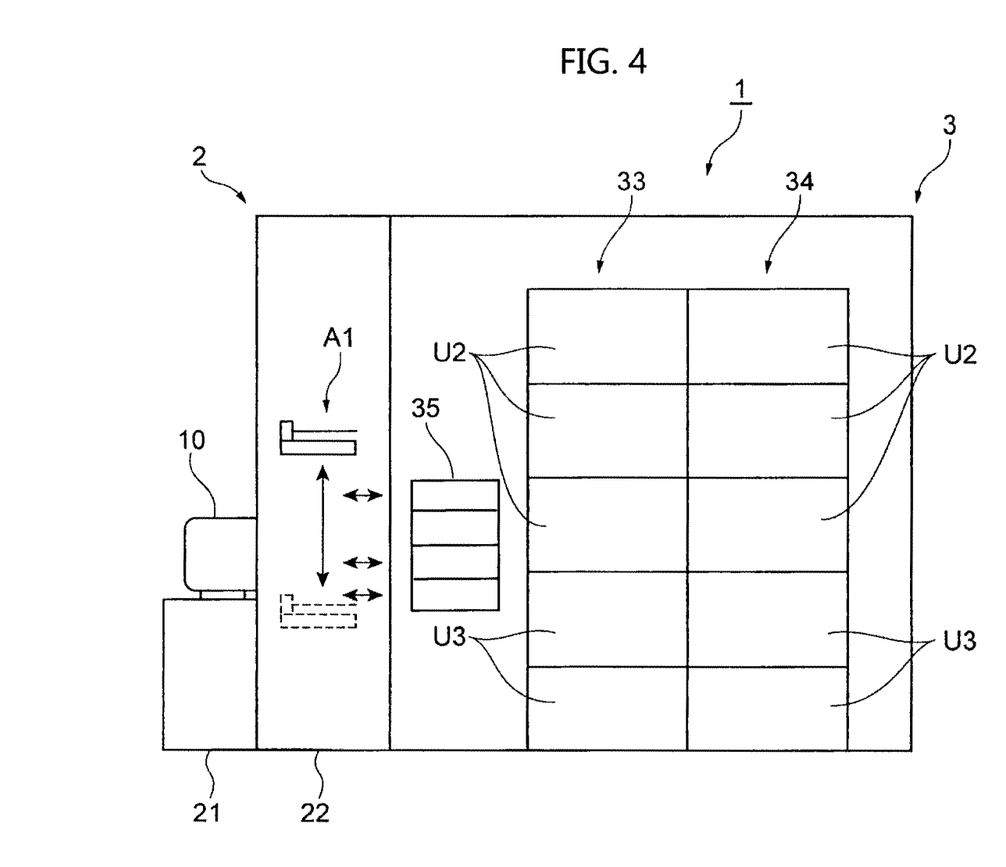
FIG. 4 is a cross-sectional view along an IV-IV line in FIG. 2.
Figure 5:
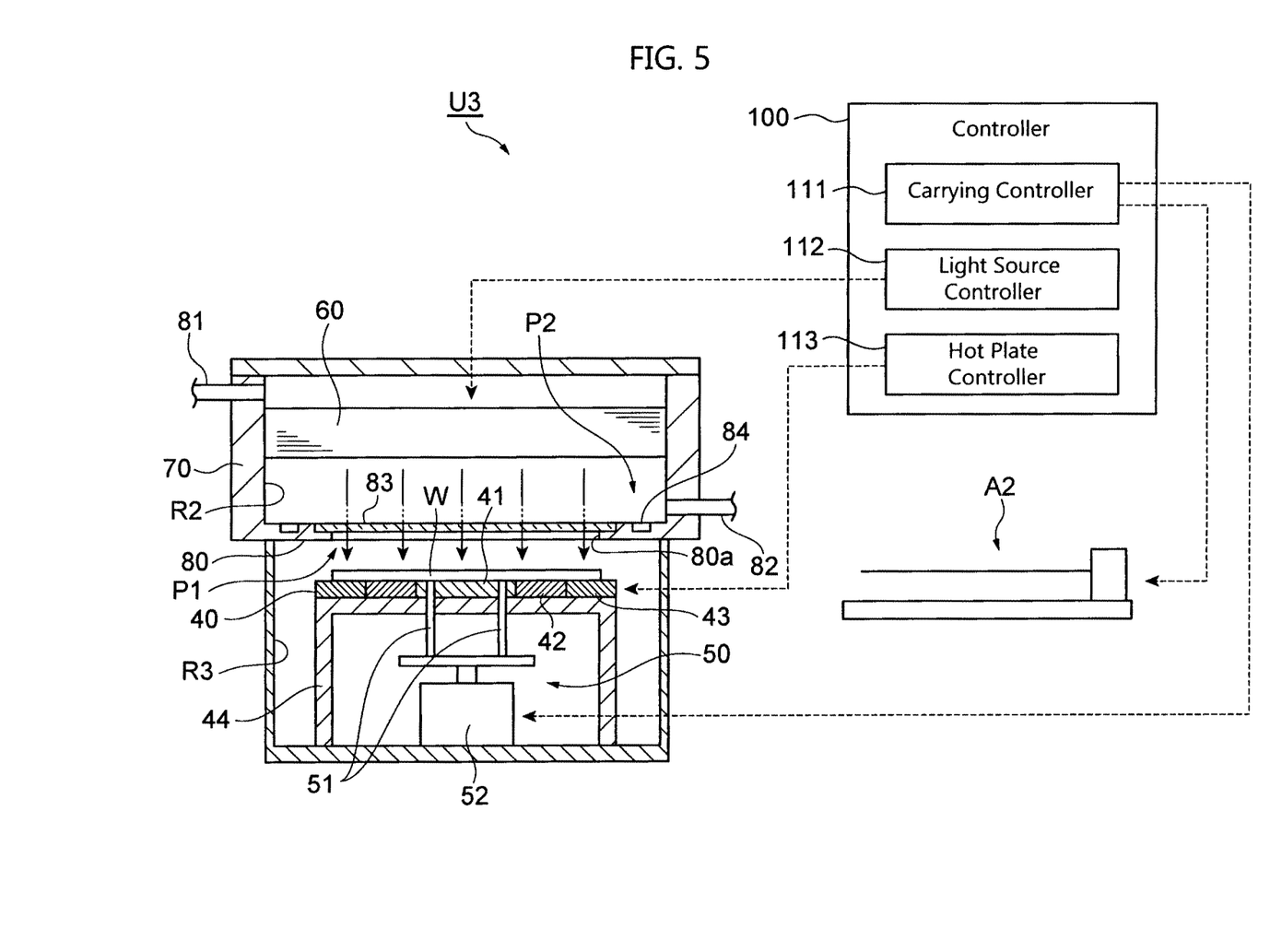
FIG. 5 is a schematic diagram illustrating a schematic structure of an etching unit.

As an example of a substrate processing apparatus, the etching unit (U3) is described in detail. As illustrated in FIG. 5, the etching unit (U3) includes a hot plate 40, a lift mechanism 50, multiple light sources 60, a case 70, and a control device 100.

Figure 6:
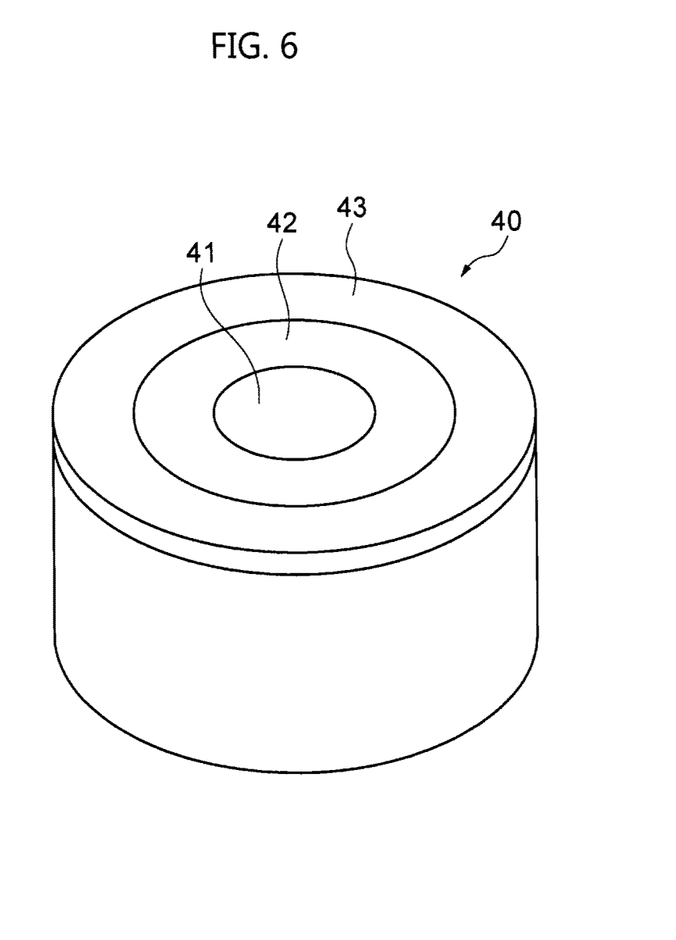
FIG. 6 is a perspective view of a hot plate.

The hot plate 40 is a plate-like heating element for supporting and heating the wafer (W) to be etched, and is supported by a support table 44. The hot plate 40 is divided into three regions (41-43). The region 41 is a circular region that forms a central part of the hot plate 40. The region 42 is an annular region that surrounds the region 41. The region 43 is an annular region that further surrounds the region 42 (see FIG. 6). A heat generating element such as a heating wire is built-in in each of the regions (41-43) of the hot plate 40. As a result, temperature adjustment for each of the regions (41-43) becomes possible. The structure of the hot plate 40 is merely an example. For example, it is also possible that the hot plate 40 is divided into more regions than the regions (41-43), or is not divided into multiple regions.

The lift mechanism 50 is provided in the support table 44, and includes multiple lift pins 51 (for example, three) and a drive part 52. The lift pins 51 project upward so as to penetrate through the hot plate 40. The drive part 52 raises or lowers the lift pins 51 so as to allow front end portions of the lift pins to extend to or retract from above the hot plate 40. As a result, the wafer (W) can be raised or lowered on the hot plate 40.

Figure 7:
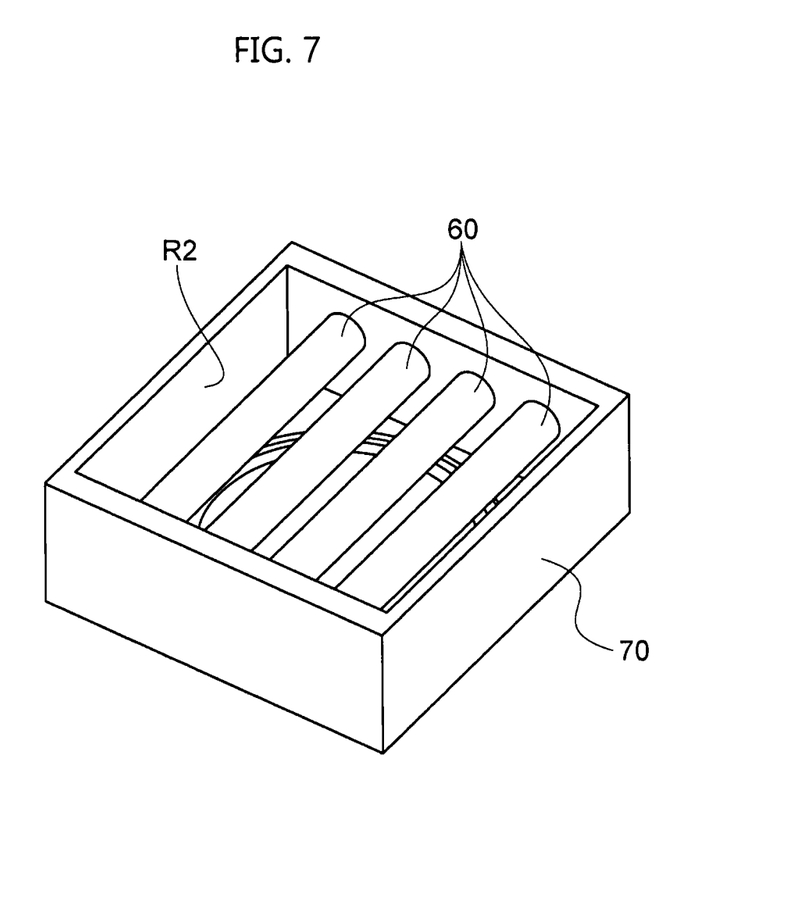
FIG. 7 is a perspective view of light sources.

The light sources 60 are arranged above the hot plate 40 and emit energy beams for etching. The energy beams are, for example, beams of ultraviolet light having a wavelength in a range of 150-400 nm. The light sources 60 each have a shape of a straight tube extending in a horizontal direction, and are arranged parallel to each other in the horizontal direction (see FIG. 7). The structure of the light sources is not limited to the one illustrated here. For example, it is also possible that the etching unit (U3) has multiple point-like light sources that are densely arranged on a plane, or has only a single light source.

The case 70 accommodates the hot plate 40, the lift mechanism 50 and the light sources 60. A partition wall 80 is provided in the case 70. The partition wall 80 partitions interior of the case 70 into a light source accommodating chamber (R2) and a hot plate accommodating chamber (R3). The light source accommodating chamber (R2) accommodates the light sources 60. The hot plate accommodating chamber (R3) accommodates the hot plate 40 and the lift mechanism 50.

An opening (80a) is provided in the partition wall 80. The opening (80a) is positioned between the light sources 60 and the hot plate 40, and is covered by a transparent plate 83 through which energy beams from the light sources 60 can be transmitted. The transparent plate 83 is, for example, a glass plate.

The opening (80a) and the transparent plate 83 form a window (P1). That is, the etching unit (U3) further includes the window (P1). The window (P1) is provided between the light sources 60 and the hot plate 40, and allows energy beams propagating from the light sources 60 toward the wafer (W) to be transmitted. The energy beams emitted from the light sources 60 pass through the window (P1) and are irradiated to the wafer (W).

An intake pipe 81 and an exhaust pipe 82 are connected to the case 70. The intake pipe 81 supplies an inert gas (nitrogen gas) into the light source accommodating chamber (R2). The exhaust pipe 82 exhausts the gas in the light source accommodating chamber (R2). As a result, the light source accommodating chamber (R2) is filled with the inert gas. In the inert gas, attenuation of the energy beams is suppressed. Therefore, while the light sources 60 are spaced apart from the window (P1), energy beams having light quantities sufficient for etching can be emitted from the window (P1). When the light sources 60 are spaced apart from the window (P1), energy beams emitted from different light sources 60 overlap each other, and illuminance spots on the wafer (W) are suppressed. Therefore, while illuminance spots are suppressed, energy beams having sufficient light quantities can be irradiated to the wafer (W).

Figure 8:
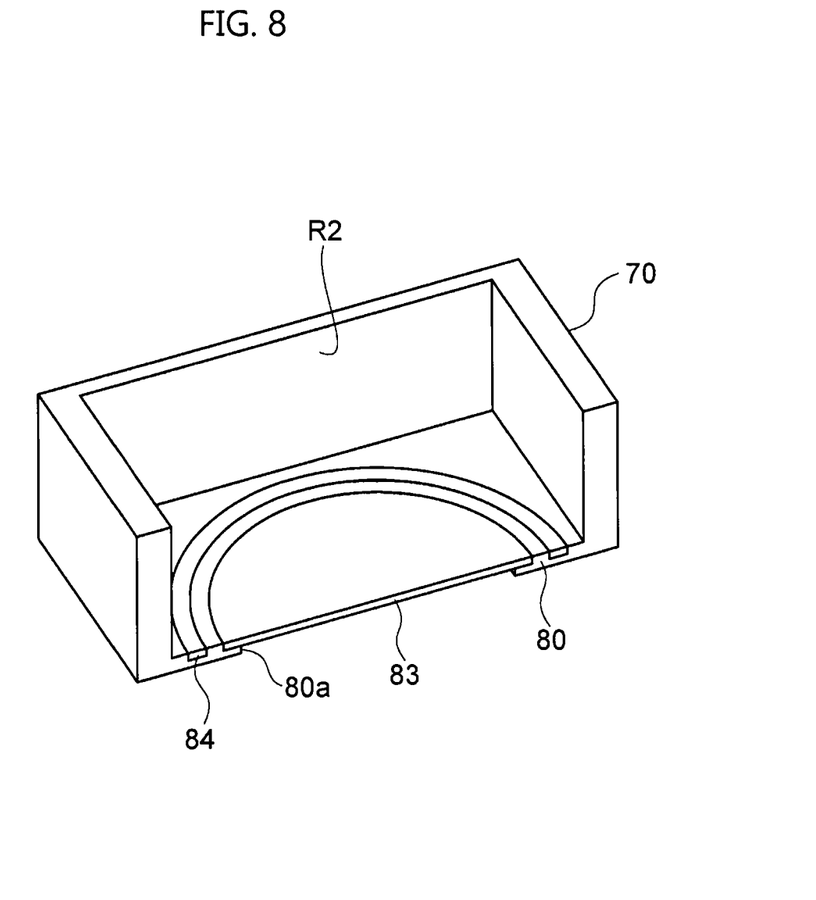
FIG. 8 is a perspective cross-sectional view of a transparent plate and a heater.

An annular heater 84 surrounding the window (P1) is embedded in the partition wall 80 (see FIG. 8). The heater 84 is a heat generating element such as a heating wire, and heats an outer peripheral portion of the window (P1). As a result, the heater 84 functions to reduce a relative temperature of a central portion of the window (P1) with a temperature of the outer peripheral portion of the window (P1) as a reference. Reducing the relative temperature of the central portion of the window (P1) with the temperature of the outer peripheral portion of the window (P1) as a reference means the same as increasing a relative temperature of the outer peripheral portion of the window (P1) with the temperature of the central portion of the window (P1) as a reference. For example, when the temperature of the outer peripheral portion of the window (P1) is lower than the temperature of the central portion of the window (P1), heating the outer peripheral portion to bring the temperature of the outer peripheral portion closer to the temperature of the central portion also corresponds to reducing the relative temperature of the central portion of the window (P1). When the temperature of the outer peripheral portion of the window (P1) is lower than the temperature of the central portion of the window (P1), cooling the central portion to bring the temperature of the central portion closer to the temperature of the outer peripheral portion also corresponds to reducing the relative temperature of the central portion of the window (P1). That is, reducing the relative temperature of the central portion of the window (P1) with the temperature of the outer peripheral portion of the window (P1) as a reference also includes uniformizing the temperature of the window (P1).

The temperature of the window (P1) affects an emission amount of energy beam from the window (P1) toward the wafer (W). For example, as the temperature of the window (P1) increases, energy beam transmittivity of the window (P1) decreases. Therefore, the heater 84 also functions to increase a relative energy beam transmission amount at the central portion of the window (P1) with an energy beam transmission amount at the outer peripheral portion of the window (P1) as a reference. Therefore, the heater 84 functions to increase a relative emission amount of energy beam from the central portion of the window (P1) toward the wafer (W) with an emission amount of energy beam from the outer peripheral portion of the window (P1) toward the wafer (W) as a reference.

When heating by the heater 84 is not performed, most of heat accumulated in the window (P1) is released from a peripheral edge of the window (P1) to the partition wall 80. Therefore, there is a tendency that the temperature of the outer peripheral portion of the window (P1) is lower than the temperature of the central portion of the window (P1). When such a temperature distribution occurs, there is a tendency that an etching amount increases in an outer peripheral portion of the wafer (W) opposing the outer peripheral portion of the window (P1). Therefore, by increasing a relative emission amount of energy beam from the central portion of the window (P1) toward the wafer (W) with an emission amount of energy beam from the outer peripheral portion of the window (P1) toward the wafer (W) as a reference, a difference between etching amounts of portions of the wafer (W) is reduced. In this way, the heater 84 functions as an adjusting device (P2) that adjusts an emission amount of energy beam from the window (P1) toward the wafer (W) depending on a portion of the window (P1) so as to reduce a difference between etching amounts of portions of the wafer (W). That is, the etching unit (U3) further includes the adjusting device (P2), and the adjusting device (P2) has the heater 84.

The control device 100 includes a carrying control device 111, a light source control device 112 and a hot plate control device 113. The carrying control device 111 controls the carrying arm (A2) and the lift mechanism 50 to carry the wafer (W) into or out from the etching unit (U3). The light source control device 112 controls the light sources 60 to emit energy beams. The hot plate control device 113 controls the hot plate 40 so that the temperature of the hot plate 40 is within a set range.

It is also possible that the hot plate control device 113 controls the hot plate 40 to reduce a relative temperature of an outer peripheral portion of the hot plate 40 with a temperature of a central portion of the hot plate 40 as a reference. For example, it also possible that the hot plate control device 113 controls the hot plate 40 to reduce a relative temperature of the region 43 with a temperature of the regions (41, 42) as a reference.

The control device 100 is structured, for example, by one or multiple control computers. In this case, functions of the control device 100 are structured by cooperation of a processor, a memory and the like of a control computer. A program that allows a control computer to function as the control device 100 may be recorded in a computer-readable recording medium. In this case, the recording medium records a program for causing an apparatus to execute a substrate heat treatment method (to be described later). Examples of the computer-readable recording medium include a hard disk, a compact disc, a flash memory, a flexible disk, a memory card, and the like.

Etching Execution Procedures

As an example of a substrate processing method, etching procedures performed by the etching unit (U3) are described.

Figure 9:
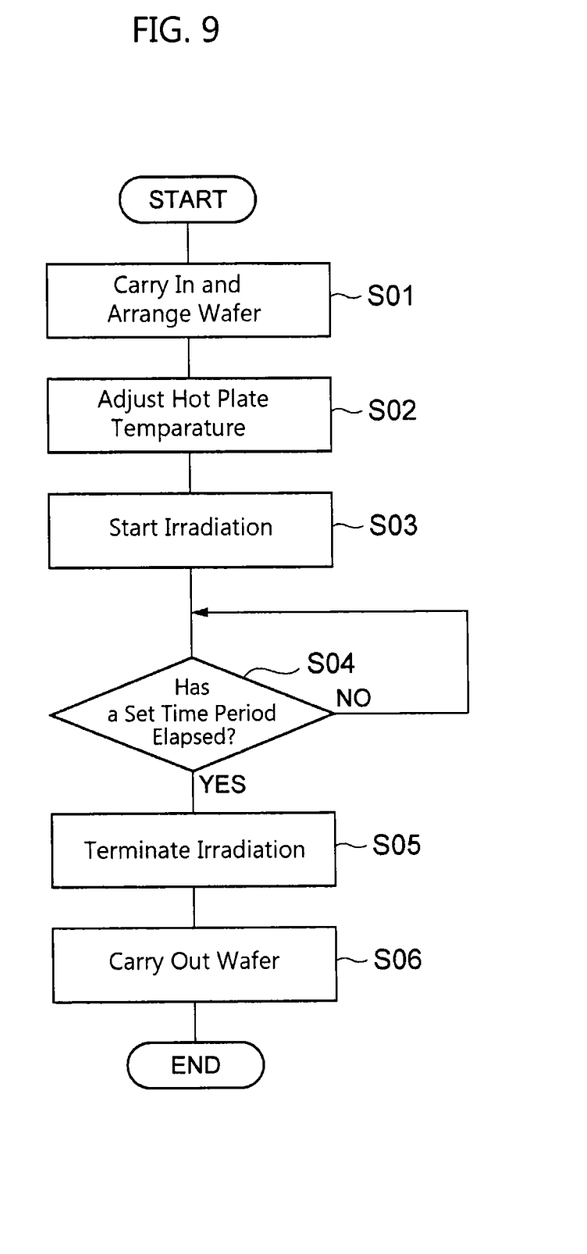
FIG. 9 is a flowchart illustrating etching procedures.

As illustrated in FIG. 9, the control device 100 of the etching unit (U3) first executes processes (S01, S02). In the process (S01), the carrying control device 111 control the carrying arm (A2) to carry a wafer (W) into the etching unit (U3), and controls the lift mechanism 50 to lower the wafer (W) and place the wafer (W) on the hot plate 40.

In the process (S02), the hot plate control device 113 controls the hot plate 40 so that the temperature of the hot plate 40 is within a set range. In this case, it is also possible that the hot plate control device 113 controls the hot plate 40 to reduce a relative temperature of an outer peripheral portion of the hot plate 40 with a central portion of the hot plate 40 as a reference. That is, it is also possible that the etching procedures include controlling the hot plate 40 to reduce the relative temperature of the outer peripheral portion of the hot plate 40 with the central portion of the hot plate 40 as a reference. Only the control that is performed by the hot plate control device 113 immediately after the wafer (W) is placed on the hot plate 40 is illustrated as the process (S02). However, it is also possible that the hot plate control device 113 is structured to constantly perform control for maintaining the temperature of the hot plate 40 in the set range.

Next, the control device 100 executes processes (S03-S05). In the process (S03), the light source control device 112 controls the light sources 60 to start emission of energy beams. In the process (S04), the light source control device 112 verifies whether or not a set time period has elapsed since the start of the emission of the energy beams. The control device 100 repeats the process (S04) until the set time period has elapsed.

Also during the execution of the process (S04), the heater 84 heats the outer peripheral portion of the window (P1). As a result, as described above, the relative temperature of the central portion of the window (P1) with the temperature of the outer peripheral portion of the window (P1) as a reference is reduced. A relative energy beam transmission amount at the central portion of the window (P1) with an energy beam transmission amount at the outer peripheral portion of the window (P1) as a reference is increased. An emission amount of energy beam from the central portion of the window (P1) toward the wafer (W) with an emission amount of energy beam from the outer peripheral portion of the window (P1) toward the wafer (W) as a reference is increased. An emission amount of energy beam from the window (P1) toward the wafer (W) depending on a portion of the window (P1) is adjusted so as to reduce a difference between etching amounts of portions of the wafer (W).

That is, the etching procedures include adjusting an emission amount of energy beam from the window (P1) toward the wafer (W) depending on a portion of the window (P1) so as to reduce a difference between etching amounts of portions of the wafer (W). As an example, the etching procedures include increasing a relative emission amount of energy beam from the central portion of the window (P1) toward the wafer (W) with an emission amount of energy beam from the outer peripheral portion of the window (P1) toward the wafer (W) as a reference. As another example, the etching procedures include increasing a relative energy beam transmission amount at the central portion of the window (P1) with an energy beam transmission amount at the outer peripheral portion of the window (P1) as a reference. As yet another example, the etching procedures include reducing the relative temperature of the central portion of the window (P1) with the temperature of the outer peripheral portion of the window (P1) as a reference.

In the process (S04), when it is determined that the set time period has elapsed, the control device 100 executes processes (S05, S06). In the process (S05), the light source control device 112 controls the light sources 60 to terminate the emission of the energy beams. In the process (S06), the carrying control device 111 controls the lift mechanism 50 to raise the wafer (W), and controls the carrying arm (A2) to carry out the wafer (W) from the etching unit (U3). As a result, the etching procedures are completed.

Effects of Present Embodiment

As described above, the etching unit (U3) includes the hot plate 40 that supports and heats the wafer (W) to be etched, the light sources 60 that emit energy beams for etching, the window (P1) that is provided between the light sources 60 and the hot plate 40 and allows the energy beams propagating from the light sources 60 toward the wafer (W) to be transmitted, and the adjusting device (P2) that adjusts an emission amount of energy beam from the window (P1) toward the wafer (W) depending on a portion of the window (P1) so as to reduce a difference between etching amounts of portions of the wafer (W).

In the structure in which energy beams are irradiated from the light sources 60 to the wafer (W) through the window (P1), there is a tendency that variation in etching amounts occurs due to states of portions of the window (P1) (such as temperature distribution and energy beam transmission amount distribution). Therefore, by adjusting, by the adjusting device (P2), the emission amounts of the energy beams from the window (P1) toward the wafer (W) in accordance with the states of the portions of the window (P1), a difference in the etching amounts of the portions of the wafer (W) can be reduced. Therefore, uniformity of the film thickness after etching can be improved.

It is also possible that the adjusting device (P2) is structured to increase a relative emission amount of energy beam from the central portion of the window (P1) toward the wafer (W) with an emission amount of energy beam from the outer peripheral portion of the window (P1) toward the wafer (W) as a reference. Most of heat accumulated in the window (P1) is released from the peripheral edge of the window (P1). Therefore, there is a tendency that the temperature of the outer peripheral portion of the window (P1) is lower than the temperature of the central portion of the window (P1). When a temperature distribution occurs in which the temperature of the outer peripheral portion of the window (P1) is lower, there is a tendency that an etching amount increases in the outer peripheral portion of the wafer (W) opposing the outer peripheral portion of the window (P1). In such a case, by increasing a relative emission amount of energy beam from the central portion of the window (P1) toward the wafer (W), a relative etching amount at the outer peripheral portion of the wafer (W) with the etching amount at the central portion of the wafer (W) as a reference can be reduced and a difference between the etching amounts of the portions of the wafer (W) can be reduced.

It is also possible that the adjusting device (P2) is structured to increase a relative energy beam transmission amount at the central portion of the window (P1) with an energy beam transmission amount at the outer peripheral portion of the window (P1) as a reference. In this case, adjustment to increase the relative emission amount of the energy beam from the central portion of the window (P1) toward the wafer (W) can be easily performed. It is not necessary to adjust an emission amount of energy beam from the window (P1) toward the wafer (W) based on an energy beam transmission amount of the window (P1). For example, in a structure in which the etching unit (U3) has multiple point-like light sources that are densely arranged on a plane, it is also possible that, by adjusting an energy beam emission amount for each of the point-like light sources, an emission amount of energy beam from the window (P1) toward the wafer (W) is adjusted.

It is also possible that the adjusting device (P2) is structured to reduce a relative temperature of the central portion of the window (P1) with the temperature of the outer peripheral portion of the window (P1) as a reference. The temperature of the window (P1) affects an emission amount of energy beam from the window (P1) toward the wafer (W). For example, as the temperature of the window (P1) increases, energy beam transmittivity of the window (P1) decreases. Therefore, the relative emission amount of the energy beam from the central portion of the window (P1) toward the wafer (W) can also be increased by a structure in which the relative temperature of the central portion of the window (P1) is reduced.

The adjusting device (P2) may have, as an element that reduces the relative temperature of the central portion of the window (P1), the heater 84 that heats the outer peripheral portion of the window (P1). However, the structure of the adjusting device (P2) is not limited to this. It is also possible that, instead of the heater 84, the adjusting device (P2) has a heat insulation material surrounding the window (P1). According to such a heat insulation material, heat release from the peripheral edge of the window (P1) is suppressed. Therefore, temperature decrease of the outer peripheral portion of the window (P1) is suppressed. Therefore, the relative temperature of the central portion of the window (P1) can also be reduced by the heat insulation material surrounding the window (P1).

It is also possible that, instead of the heater 84 that heats the outer peripheral portion of the window (P1), the adjusting device (P2) has a cooler that cools the central portion of the window (P1).

Figure 10:
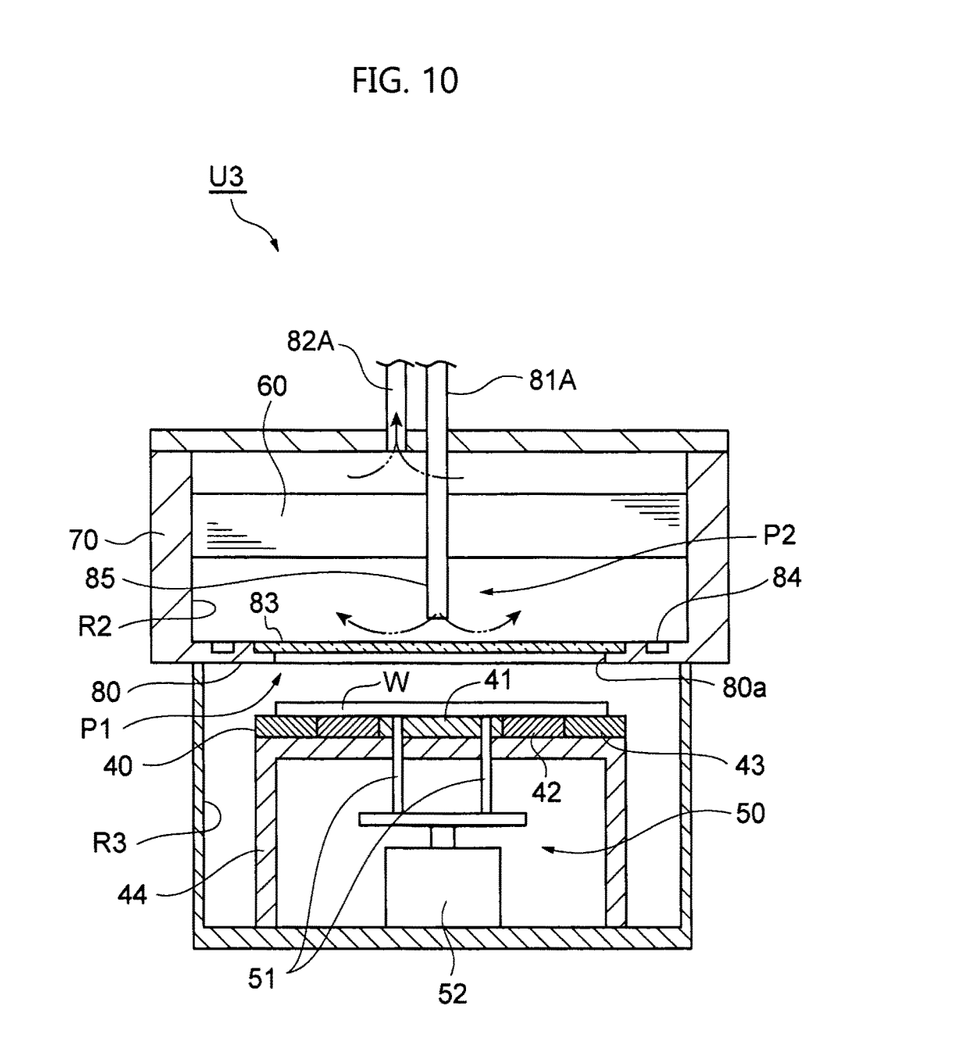
FIG. 10 is a schematic diagram illustrating a modified embodiment of the etching unit.

In the etching unit (U3) illustrated in FIG. 10, the intake pipe 81 and the exhaust pipe 82 are replaced by an intake pipe (81A) and an exhaust pipe (82A), and a cooler 85 is structured by the intake pipe (81A) and the exhaust pipe (82A). The intake pipe (81A) is inserted into the light source accommodating chamber (R2) downwardly from an upper central portion of the hot plate 40 and opens toward the central part of the window (P1). The exhaust pipe (82A), in a vicinity of the intake pipe (81A), opens to an upper portion of the light source accommodating chamber (R2). The intake pipe (81A) supplies an inert gas into the light source accommodating chamber (R2), while blowing the inert gas to the central portion of the window (P1). The exhaust pipe (82A) exhausts the gas in the light source accommodating chamber (R2). By blowing the inert gas to the central portion of the window (P1), the central portion of the window (P1) is cooled. That is, the cooler 85 is structured to blow an inert gas from the light sources 60 side to the central portion of the window (P1). According to the structure in which an inert gas is blown from the light sources 60 side to the central portion of the window (P1), the cooler 85 can be easily structured by effectively utilizing a supply part of an inert gas.

The adjusting device (P2) may have two or more of the heater 84, the cooler 85 and the heat insulation material.

The control device 100 may be further provided that controls the hot plate 40 to reduce the relative temperature of the outer peripheral portion of the hot plate 40 with the temperature of the central portion of the hot plate 40 as a reference. A temperature of an etching object affects an etching amount. Specifically, as the temperature of the etching object increases, the etching amount increases. Therefore, by reducing the relative temperature of the outer peripheral portion of the hot plate 40, the etching amount at the outer peripheral portion of the wafer (W) can be reduced. Therefore, in addition to increasing the relative emission amount of the energy beam from the central portion of the window (P1) toward the wafer (W), by reducing the relative temperature of the outer peripheral portion of the hot plate 40, the difference between the etching amounts of the portions of the wafer (W) can be reliably reduced.

Figure 11:
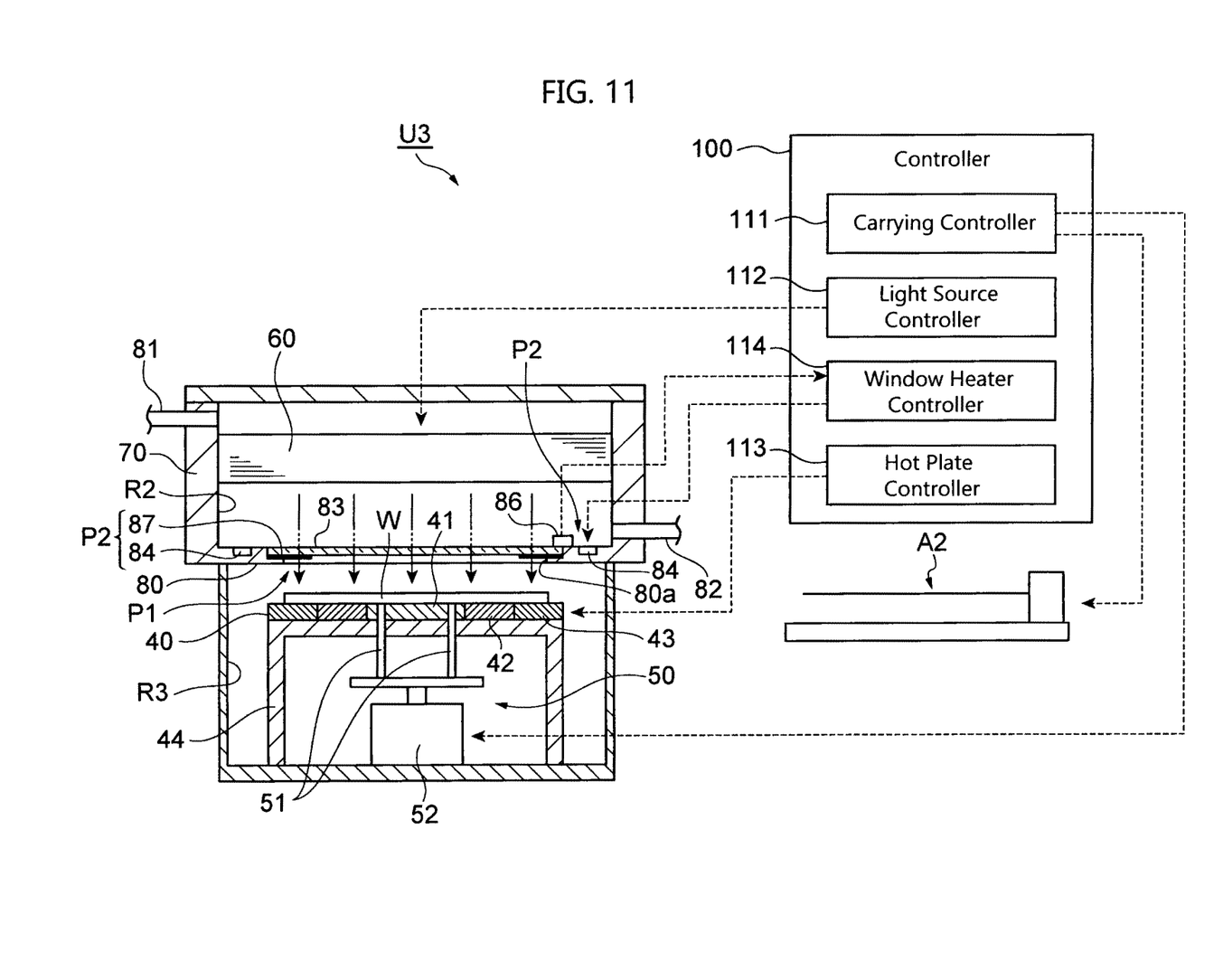
FIG. 11 is schematic diagram illustrating another modified embodiment of the etching unit.

It is also possible that the etching unit (U3) is structured to be able to control the temperature of the window (P1). For example, in the etching unit (U3) illustrated in FIG. 11, a temperature sensor 86 is further provided near the outer periphery of the window (P1). The temperature sensor 86 detects a temperature near the outer periphery of the window (P1). The control device 100 of the etching unit (U3) of FIG. 11 is structured to control the adjusting device (P2) such that the temperature of the temperature sensor 86 is within a set range. As an example, the control device 100 further includes a window heater control device 114 in addition to the carrying control device 111, the light source control device 112 and the hot plate control device 113. The window heater control device 114 controls the heater 84 such that the temperature of the temperature sensor 86 is within the set range. As a result, overheating of the window (P1) is prevented.

The adjusting device (P2) may further have a filter 87 that reduces the energy beam transmission amount at the outer peripheral portion of the window (P1) (see FIG. 11). A method for forming the filter 87 is not particularly limited. The filter 87 may be formed by overlapping a sheet-like member on the transparent plate 83, or by subjecting a surface of the transparent plate 83 to surface roughening. The relative energy beam transmission amount at the central portion of the window (P1) can also be increased by the filter 87. It is not necessary for the adjusting device (P2) having the filter 87 to have the heater 84, the cooler 85 or the heat insulation material.

In the above, the embodiment has been described. However, the present disclosure is not necessarily limited to the above-described embodiment, but various modifications are possible within the scope without departing from the spirit of the present disclosure. An object to be processed is not limited to a semiconductor wafer, but, for example, may also be a glass substrate, a mask substrate, or an FPD (Flat Panel Display).

A substrate processing apparatus according to an embodiment of the present invention and a method according to an embodiment of the present invention can improve uniformity of film thickness after etching in a process in which the film thickness is adjusted by etching.

A substrate processing apparatus according to an embodiment of the present invention includes a hot plate that supports and heats a substrate to be etched, a light source that emits energy beam for etching, a window that is provided between the light source and the hot plate and allows the energy beam propagating from the light source toward the substrate to be transmitted, and an adjusting device that adjusts an emission amount of energy beam from the window toward the substrate depending on a portion of the window so as to reduce a difference between etching amounts of portions of the substrate.

In the structure in which the energy beam is irradiated from the light source to the substrate through the window, there is a tendency that variation in etching amounts occurs due to states of portions of the window (such as temperature distribution and energy beam transmission amount distribution). Therefore, by adjusting, by the adjusting device, the emission amount of the energy beam from the window toward the substrate in accordance with the states of the portions of the window, a difference in the etching amounts of the portions of the substrate can be reduced. Therefore, uniformity of the film thickness after etching can be improved.

It is also possible that the adjusting device is structured to increase a relative emission amount of energy beam from a central portion of the window toward the substrate with an emission amount of energy beam from an outer peripheral portion of the window toward the substrate as a reference. Most of heat accumulated in the window is released from a peripheral edge of the window. Therefore, there is a tendency that a temperature of the outer peripheral portion of the window is lower than a temperature of a central portion of the window. When a temperature distribution occurs in which the temperature of the outer peripheral portion of the window is lower, there is a tendency that an etching amount increases in an outer peripheral portion of the substrate opposing the outer peripheral portion of the window. In such a case, by increasing a relative emission amount of energy beam from the central portion of the window toward the substrate, a relative etching amount at the outer peripheral portion of the substrate with an etching amount at a central portion of the substrate as a reference can be reduced and a difference between the etching amounts of the portions of the substrate can be reduced.

It is also possible that the adjusting device is structured to increase a relative energy beam transmission amount at the central portion of the window with an energy beam transmission amount at the outer peripheral portion of the window as a reference. In this case, adjustment to increase the relative emission amount of the energy beam from the central portion of the window toward the substrate can be easily performed.

It is also possible that the adjusting device is structured to reduce a relative temperature of the central portion of the window with the temperature of the outer peripheral portion of the window as a reference. The temperature of the window affects an emission amount of energy beam from the window toward the substrate. For example, as the temperature of the window increases, energy beam transmittivity of the window decreases. Therefore, the relative emission amount of the energy beam from the central portion of the window toward the substrate can also be increased by a structure in which the relative temperature of the central portion of the window is reduced.

The adjusting device may have a heater that heats the outer peripheral portion of the window. The adjusting device may have a cooler that cools the central portion of the window.

The cooler may be structured to blow an inert gas from the light source side to the central portion of the window. When an inert gas is supplied to between the light source and the window, attenuation of energy beam during propagation from the light source to the window can be suppressed, and high efficiency of etching can be achieved. According to the structure in which an inert gas is blown from the light source side to the central portion of the window, the cooler 85 can be easily structured by effectively utilizing a supply part of an inert gas.

The adjusting device may further have a filter that reduces the energy beam transmission amount at the outer peripheral portion of the window. The relative energy beam transmission amount at the central portion of the window can also be increased by the filter.

A control device may be further provided that controls the hot plate to reduce the relative temperature of the outer peripheral portion of the hot plate with the temperature of the central portion of the hot plate as a reference. A temperature of an etching object affects an etching amount. Specifically, as the temperature of the etching object increases, the etching amount increases. Therefore, by reducing the relative temperature of the outer peripheral portion of the hot plate, the etching amount at the outer peripheral portion of the substrate is reduced. Therefore, in addition to increasing the relative emission amount of the energy beam from the central portion of the window toward the substrate, by reducing the relative temperature of the outer peripheral portion of the hot plate, the difference between the etching amounts of the portions of the substrate can be reliably reduced.

A substrate processing method according to an embodiment of the present invention includes arranging a substrate on a hot plate, emitting energy beam for etching from a light source, irradiating the energy beam from the light source to the substrate by allowing the energy beam to be transmitted through a window that is provided between the light source and the hot plate, and adjusting an emission amount of energy beam from the window toward the substrate depending on a portion of the window so as to reduce a difference between etching amounts of portions of the substrate.

It is also possible to adjust an emission amount of energy beam from the window toward the substrate such that a relative emission amount of energy beam from the central portion of the window toward the substrate with an emission amount of energy beam from the outer peripheral portion of the window toward the substrate as a reference is increased.

It is also possible to adjust an emission amount of energy beam from the window toward the substrate by increasing a relative energy beam emission amount at the central portion of the window with an energy beam emission amount at the outer peripheral portion of the window as a reference.

It is also possible to adjust an emission amount of energy beam from the window toward the substrate by reducing a relative temperature of the central portion of the window with a temperature of the outer peripheral portion of the window as a reference.

It is also possible to further include controlling the hot plate to reduce a relative temperature of the outer peripheral portion of the hot plate with a temperature of the central portion of the hot plate as a reference.

According to an embodiment of the present invention, uniformity of film thickness after etching can be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate processing apparatus, comprising:
   a hot plate configured to support and heat a substrate;
   a light source configured to emit etching energy beam such that the etching energy beam etches the substrate held by the hot plate;
   a window device positioned between the light source and the hot plate and configured to transmit the etching energy beam emitted by the light source toward the substrate; and
   an adjusting device configured to adjust emission amounts of the etching energy beam from portions of the window device toward the substrate such that the adjusting device reduces difference in etching amounts of portions of the substrate,
   wherein the adjusting device is configured to adjust the emission amounts of the etching energy beam such that an emission amount of the etching energy beam from a central portion of the window device toward the substrate is increased relative to an emission amount of the etching energy beam from an outer peripheral portion of the window device toward the substrate as a reference.

2. A substrate processing apparatus according to claim 1, wherein the adjusting device is configured to adjust the emission amounts of the etching energy beam such that a transmission amount of the etching energy beam at the central portion of the window device is increased relative to a transmission amount of the etching energy beam at the outer peripheral portion of the window device as a reference.

3. A substrate processing apparatus according to claim 2, wherein the adjusting device comprises a filter configured to reduce a transmission amount of the etching energy beam at the outer peripheral portion of the window.

4. A substrate processing apparatus according to claim 2, wherein the adjusting device is configured to adjust the emission amounts of the etching energy beam such that a temperature of the central portion of the window device is reduced relative to a temperature of the outer peripheral portion of the window device as a reference.

5. A substrate processing apparatus according to claim 4, wherein the adjusting device comprises a heating device configured to heat the outer peripheral portion of the window device.

6. A substrate processing apparatus according to claim 4, wherein the adjusting device comprises a cooling device configured to cool the central portion of the window device.

7. A substrate processing apparatus according to claim 6, wherein the cooling device is configured to blow an inert gas from a light source side to the central portion of the window device.

8. A substrate processing apparatus according to claim 2, further comprising:
   a control device comprising circuitry configured to control the hot plate such that a temperature of the outer peripheral portion of the hot plate is reduced relative to a temperature of the central portion of the hot plate as a reference.

9. A substrate processing apparatus according to claim 1, wherein the adjusting device is configured to adjust the emission amounts of the etching energy beam such that a temperature of the central portion of the window device is reduced relative to a temperature of the outer peripheral portion of the window device as a reference.

10. A substrate processing apparatus according to claim 9, wherein the adjusting device comprises a heating device configured to heat the outer peripheral portion of the window device.

11. A substrate processing apparatus according to claim 10, wherein the adjusting device comprises a cooling device configured to cool the central portion of the window device.

12. A substrate processing apparatus according to claim 9, wherein the adjusting device comprises a cooling device configured to cool the central portion of the window device.

13. A substrate processing apparatus according to claim 12, wherein the cooling device is configured to blow an inert gas from a light source side to the central portion of the window device.

14. A substrate processing apparatus according to claim 9, wherein the adjusting device comprises a filter configured to reduce a transmission amount of the etching energy beam at the outer peripheral portion of the window.

15. A substrate processing apparatus according to claim 9, further comprising:
a control device comprising circuitry configured to control the hot plate such that a temperature of the outer peripheral portion of the hot plate is reduced relative to a temperature of the central portion of the hot plate as a reference.

16. A substrate processing apparatus according to claim 1, further comprising:
a control device comprising circuitry configured to control the hot plate such that a temperature of the outer peripheral portion of the hot plate is reduced relative to a temperature of the central portion of the hot plate as a reference.

17. A method for processing a substrate, comprising:
positioning a substrate on a hot plate configured to hold and heat the substrate;
emitting etching energy beam from a light source to the substrate held by the hot plate such that the etching energy beam is transmitted through a window device positioned between the light source and the hot plate and irradiates the substrate; and
adjusting emission amounts of the etching energy beam from portions of the window device toward the substrate such that difference in etching amounts of portions of the substrate is reduced,
wherein the adjusting of the emission amounts of the etching energy beam comprises increasing an emission amount of the etching energy beam from a central portion of the window device toward the substrate relative to an emission amount of the etching energy beam from an outer peripheral portion of the window device toward the substrate as a reference.

18. A method for processing a substrate according to claim 17, wherein the adjusting of the emission amounts of the etching energy beam comprises increasing a transmission amount of the etching energy beam at the central portion of the window device relative to a transmission amount of the etching energy beam at the outer peripheral portion of the window device as a reference.

19. A method for processing a substrate according to claim 17, wherein the adjusting of the emission amounts of the etching energy beam comprises reducing a temperature of the central portion of the window device relative to a temperature of the outer peripheral portion of the window device as a reference.

20. A method for processing a substrate according to claim 17, further comprising:
controlling the hot plate such that a temperature of the outer peripheral portion of the hot plate relative to a temperature of the central portion of the hot plate as a reference.

* * * * *